(12) United States Patent
Paulson et al.

(10) Patent No.: US 8,143,512 B2
(45) Date of Patent: Mar. 27, 2012

(54) JUNCTIONS IN SUBSTRATE SOLAR CELLS

(75) Inventors: Puthur D. Paulson, San Jose, CA (US);
Charlie Hotz, Mountain View, CA (US);
Craig Leidholm, San Jose, CA (US);
Damoder Reddy, Los Gatos, CA (US)

(73) Assignee: Solexant Corp., San Jose, CA (US)

( * ) Notice: Subject to any disclaimer, the term of this patent is extended or adjusted under 35 U.S.C. 154(b) by 181 days.

(21) Appl. No.: 12/383,532

(22) Filed: Mar. 24, 2009

(65) Prior Publication Data

US 2009/0242029 A1 Oct. 1, 2009

Related U.S. Application Data

(60) Provisional application No. 61/070,903, filed on Mar. 26, 2008.

(51) Int. Cl.
*H01L 31/00* (2006.01)

(52) U.S. Cl. ............... 136/252; 136/260; 136/264

(58) Field of Classification Search .................. None
See application file for complete search history.

(56) References Cited

U.S. PATENT DOCUMENTS

| | | | |
|---|---|---|---|
| 4,456,630 A | 6/1984 | Basol et al. | |
| 4,568,792 A * | 2/1986 | Mooney et al. | 136/260 |
| 5,472,910 A | 12/1995 | Johnson et al. | |
| 5,501,744 A * | 3/1996 | Albright et al. | 136/258 |
| 5,557,146 A | 9/1996 | Britt et al. | |
| 5,738,731 A | 4/1998 | Shindo et al. | |
| 5,909,632 A | 6/1999 | Gessert | |
| 6,537,845 B1 | 3/2003 | McCandless et al. | |
| 7,220,321 B2 | 5/2007 | Barth et al. | |
| 2004/0178426 A1 | 9/2004 | Melekhov et al. | |
| 2004/0185672 A1 | 9/2004 | Polichar et al. | |
| 2005/0186342 A1 | 8/2005 | Sager et al. | |
| 2005/0224111 A1 | 10/2005 | Cunningham et al. | |
| 2006/0060237 A1 | 3/2006 | Leidholm et al. | |
| 2007/0163383 A1 | 7/2007 | Van Duren et al. | |
| 2007/0169811 A1 | 7/2007 | Van Duren et al. | |
| 2007/0194694 A1 | 8/2007 | Reddy | |

(Continued)

FOREIGN PATENT DOCUMENTS

WO WO 2004022637 A2 3/2004

OTHER PUBLICATIONS

Studies of ZnTe Back Contacts to CdS/CdTe Solar Cells Gessert, T.A. et al., Presented at the 26th IEEE Photovoltaic Specialists Conference, Sep. 29B. Oct. 1997.

(Continued)

*Primary Examiner* — Alexa Neckel
*Assistant Examiner* — Shannon Gardner
(74) *Attorney, Agent, or Firm* — Charles R. Nold; Nold Intellectual Property Law

(57) ABSTRACT

The present invention discloses thin film photovoltaic devices comprising Group II-VI semiconductor layers with a substrate configuration having an interface layer between the absorber layer and the window layer to create improved junctions.

The present invention also discloses methods for making and surface treatments for thin film photovoltaic devices comprising Group II-VI semiconductor layers with a substrate configuration to create devices with improved junctions.

15 Claims, 3 Drawing Sheets

U.S. PATENT DOCUMENTS

| | | |
|---|---|---|
| 2007/0215197 A1 | 9/2007 | Buller et al. |
| 2008/0000524 A1 | 1/2008 | Deng |
| 2008/0223430 A1 | 9/2008 | Krasnov et al. |
| 2008/0308148 A1 | 12/2008 | Leidholm et al. |
| 2009/0235983 A1 | 9/2009 | Girt et al. |

OTHER PUBLICATIONS

Devel. of Cu-doped ZnTe for CdS/CdTe solar cells. Gessert, T.A. et al.; J. of Vacuum Science & Technology A: Vacuum, Surfaces, and Films May 1996 V. 14, I: 3, pp. 806-812.

Zhong et al, Alloyed ZnxCd1—xS nanocrystals with highly narrow luminescence spectral width, J. Am. Chem. Soc. 125 (2003) 13559-13563

Nie, S.M. et al.; Alloyed semiconductor quantum dots: tuning the optical properties without changing the particle size, J. Am. Chem. Soc. 125 (2003) 7100-7106.

A Novel Chemical Route to ZnTe Semiconductor Nanorods; Li, Yadong et al. Advanced Materials 11(10), pp. 847-850 (1999).

Cation Exchange Reactions in Ionic Nanocrystals; Alivisatos et al. Science Nov. 5, 2004, vol. 306, No. 5698, pp. 1009-1012.

Type-II Quantum Dots: . . . Heterostructures; Bawendi et al. J. Am. Chem. Soc., 2003, 125 (38), 11466-11467.

Singh et al., Thin film CdTe-CdS heterojunction solar cells on lightweight metal substrates, Solar Energy Materials and Solar Cells, 59 (1999) 145-161.

Singh et al., Design issues in the garication of CdS-CdTe solar cells on molybderium foil substrates, Solar Energy Materials and Solar Cells 76 (2003) 369-385.

Chavez et al., Evaporated cadmium telluride film on steel foil substrates, Journal of Materials Science: Materials in Electronics 6 (1995) 21-24.

Matulionis et al., Cadmium Telluride Solar Cells on Molybdenum Substrates, Mat. Res. Soc. Symp. Proc. vol. 668 (2001).

\* cited by examiner

JUNCTIONS IN SUBSTRATE SOLAR CELLS

CROSS REFERENCE TO RELATED APPLICATIONS

This application claims priority to U.S. Provisional Patent Application Ser. No. 61/070,903 filed Mar. 26, 2008 the contents of which is incorporated herein by reference.

BACKGROUND OF THE INVENTION

Increasing oil prices have heightened the importance of developing cost effective renewable energy. Significant efforts are underway around the world to develop cost effective solar cells to harvest solar energy. In order for solar cells to be cost effective with traditional sources of energy solar cells must be manufactured at a cost well below $1/watt.

Current solar energy technologies can be broadly categorized as crystalline silicon and thin film technologies. Approximately 90% of the solar cells are made from silicon—single crystal silicon or polycrystalline silicon. Crystalline silicon (c-Si) has been used as the light-absorbing semiconductor in most solar cells, even though it is a relatively poor absorber of light and requires a considerable thickness (several hundred microns) of material. Nevertheless, it has proved convenient because it yields stable solar modules with good efficiencies (13-18%, half to two-thirds of the theoretical maximum) and uses process technology developed from the knowledge base of the microelectronics industry. Silicon solar cells are very expensive with manufacturing cost above $3.50/watt.

Second generation solar cell technology is based on thin films. Main thin film technologies are Amorphous Silicon, Copper Indium Gallium Selenide (CIGS), and Cadmium Telluride (CdTe).

Amorphous silicon (a-Si) was viewed as the "only" thin film PV material in the 1980s. But by the end of that decade, and in the early 1990s, it was written off by many observers for its low efficiencies and instability. However, amorphous silicon technology has made good progress toward developing a very sophisticated solution to these problems: multijunction configurations. Now, commercial, multijunction a-Si modules in the 7-9% efficiency range are being produced by several companies. A number of companies such as Kaneka, Sharp, Schott Solar, Ersol, etc., are manufacturing amorphous silicon solar cells on glass substrates by adopting commercially proven CVD process to deposit a-Si originally developed for flat panel display manufacturing. Equipment companies such as Applied Materials are offering turn-key systems to manufacture a-Si solar cells on glass substrates. The key obstacles to a-Si technology are low efficiencies, light-induced efficiency degradation (which requires more complicated cell designs such as multiple junctions), and process costs (fabrication methods are vacuum-based and fairly slow). United Solar has pioneered triple junction a-Si solar cells on flexible stainless steel substrates. However, a-Si solar cells are expensive to manufacture (>$2.5/watt).

Thin film solar cells made from Copper Indium Gallium Diselenide (CIGS) absorbers show promise in achieving high conversion efficiencies of 10-12%. The record high efficiency of CIGS solar cells (19.9% NREL) is by far the highest compared with those achieved by other thin film technologies. These record breaking small area devices have been fabricated using vacuum evaporation techniques which are capital intensive and quite costly. A number of companies (Honda, Showa Shell, Wurth Solar, Nanosolar, Miasole etc.) are developing CIGS solar cells on glass substrates and flexible substrates. However, it is very challenging to fabricate CIGS thin films of uniform composition on large area substrates. This limitation also affects the process yield, which are generally quite low. Because of these limitations, implementation of evaporation techniques has not been successful for large-scale, low-cost commercial production of CIGS solar cells. It is extremely unlikely that CIGS solar cells can be produced below $1/watt manufacturing cost.

CdTe thin film solar cells are very simple to make and have the potential to achieve lowest manufacturing cost compared to all other solar cell technologies. CdTe solar cells with 16.5% efficiency have been demonstrated by NREL. First Solar based in Arizona is producing CdTe solar cells on glass substrates at a manufacturing cost of $1.12/watt. First Solar expects to reduce the cost to below $1/watt by the end of 2009 when it ramps up its annual manufacturing capacity to 1 GW. Further reduction in manufacturing cost of CdTe solar cells is not readily achievable because of relatively slow piece by piece manufacturing process.

CdTe solar cells are made by depositing CdTe on 3 mm thick glass substrates and encapsulated with a second 3 mm cover glass. Hence they are produced by a slow piece by piece manufacturing process. Further reduction in manufacturing cost of CdTe solar cells to well below $1/watt is not readily achievable because of slow piece by piece manufacturing process. These CdTe solar cells are also very heavy and cannot be used for residential rooftop applications—one of the largest market segments of solar industry. Opportunity exists to innovate by developing CdTe solar cell on flexible substrate that can be manufactured by a continuous roll to roll process to significantly reduce manufacturing cost. Flexible solar cells will also be light weight making them suitable for residential roof top applications which are not accessible to CdTe on heavy glass substrates.

Superstrate solar cell configurations are known in the art and have a configuration comprising a substrate which is transparent and faces the sun to generate photovoltaic output. A transparent contact, commonly Indium doped tin oxide (ITO) or Fluorine doped tin oxide (FTO) film is deposited on the substrate followed by CdS window layer. In general the transparent conducting oxide (TCO) is a bilayer consisting of a 200-400 nm thick highly conducting layer with sheet resistance 5-10 $\Omega/cm^3$ and a 20-50 nm thick resistive layer with resistance 1-2 $\Omega$-cm. A junction is formed by depositing a CdTe absorber layer using deposition techniques such as close spaced sublimation (CSS), sputtering, electrodeposition, screen printing & sintering or spray pyrolysis. The substrate temperature varies from one deposition technique to other; >600° C. for CSS and ~100° C. for electrodeposition. $CdCl_2$ treatments, generally at 400° C., are carried out on this device structure to improve the grain size and electronic properties. During the high temperature junction formation or the subsequent $CdCl_2$ treatment significant CdTe—CdS interdiffusion is observed, which enable the fabrication of high efficiency devices. $CdCl_2$ treatment is followed by the contact treatments to form pseudo-ohmic contact to CdTe. Due to its high work function and it is not possible to dope CdTe>$10^{16}$ cm3 and also there are no metals available that have a work function higher than CdTe, it is not possible to form ohmic contact to CdTe without the contact treatments. Contact treatments involves either etch treatments such as Br-Methanol or Nitric-Phosphoric acid (NP) or the deposition of interface layers such as $Cu_2Te$, $Sb_2Te_3$, $Bi_2Te_3$, CuZnTe, HgCdTe that can be doped P+ to form pseudo ohmic or tunneling contacts. Metal electrodes are deposited on surface treated CdTe films using known techniques.

Substrate configuration solar cells are required when opaque substrates such as metal foil substrates are used for high volume production of CdTe/CdS devices. This change in the device configuration necessitates a substantial deviation from the conventional junction formation processing. Prior art substrate CdS/CdTe device performance is inferior to superstrate prior art devices. This is a result of the process advantages associated with the superstrate configuration such as enhanced CdS—CdTe inter-diffusion at higher CdTe processing temperature and the availability of post deposition CdTe surface for ohmic contact processing.

SUMMARY OF THE INVENTION

In one embodiment there is disclosed a photovoltaic device having a substrate configuration comprising a transparent or opaque substrate, a metal electrode layer, a TCO layer an absorber layer comprising a Group II-VI semiconductor compound, a window layer, and an interface layer between the absorber layer and the window layer. Preferably the absorber layer comprises CdTe and the window layer comprises CdS. Further, the absorber layer and/or the interface layer comprise a thin film, nanoparticles and/or nanoparticles that are sintered. In one embodiment the absorber layer and/or the interface layer comprises a plurality of grain sizes. In one embodiment the interface layer comprises a Cd rich $CdTe_{1-x}$ where $0<x<1$ composition. In another embodiment the interface layer comprises a Tellurium rich $Cd_{1-x}Te$ composition where $0<x<1$. In one embodiment a portion of said interface layer located next to the absorber layer comprises large grains sizes, and a portion of said interface layer located next to the window layer comprises small grain sizes. In one embodiment the large grain sizes are about 2.0 μm to about 6.0 μm and the small grain sizes are about 0.1 μm to about 1.0 μm. In another embodiment the large grain sizes are about 2.0 μm to about 3.0 μm, and the large grain sizes are about 0.2 μm to about 0.5 μm. In one embodiment the interface layer comprises a Group II-VI compound. In one embodiment the interface layer comprises at least three layers, where a first layer comprises a Group II-VI compound located next to the window layer, and a third layer comprises a Group II-VI compound located next to the absorber layer, and a second layer comprising a Group $II-VI^a_{1-x}VI^b_x$ compound, where $0<x<1$ and $a \neq b$ located between the first and second layers. In one embodiment the interface layer comprises at least one layer comprising $CdTe_{1-x}S_x$ where $0<x<1$. In another embodiment said interface layer comprises at least three layers, the first layer comprises CdS, a third layer comprises CdTe, and at least one second layer comprising $CdTe_{1-x}S_x$ where $0<x<1$, said at least one second layer is positioned in between the first and third layers. In one embodiment a buried junction is located between the absorber layer and the window layer. In another embodiment of the present invention the interface layer is created by a surface treatment of the absorber layer where the surface treatment may comprise one or more of wet etching, dry etching, sputtering, reduction, electrochemical, heat treatments and ion milling.

Further disclosed herein is a process for making a photovoltaic device having a substrate configuration, comprising the steps of providing a substrate, forming an electrode, forming an absorber layer comprising a Group II-VI compound, forming a window layer, forming a TCO layer on the window layer, and forming an interface layer between the absorber layer and window layer. In one embodiment the absorber layer is subjected to at least one surface treatment to create the interface layer. In another embodiment the surface treatment is selected from the group consisting of wet etching, dry etching, sputtering, reduction, electrochemical, heat treatments and ion milling. In another embodiment the absorber layer comprises a Group II-VI compound, and the surface treatment creates Group VI vacancies in the absorber layer. The Group II-VI compound may be Cd compound and the Group VI vacancies may be Te. Further disclosed is forming an absorber layer and/or an interface layer comprising a plurality of grain sizes. In one embodiment the absorber layer and/or interface layer is deposited by an evaporation process, and the substrate temperature is varied during the evaporation process. In this embodiment the substrate temperature may be varied from 350° C. to 620° C. In another embodiment a first layer is deposited and sintered at a high temperature, preferably greater than 500° C. and a second layer is deposited and sintered at a low temperature, preferably less than 500° C. In another embodiment the absorber layer comprises a Cd rich CdTe composition and after a window layer comprising CdS is formed, and the device is sintered.

In one embodiment the interface layer comprises a Group $II-VII_{1-x}S_x$ compound, where $0<x<1$. In another embodiment the interface layer is deposited by an evaporation process wherein the substrate temperature is varied during the evaporation process. The invention also contemplates an interface layer comprising at least two layers where each of the at least two layers are formed by depositing a Group $II-VI_{1-x}S_x$ compound, where $0<x<1$, but x is different in at least two layers. During deposition the invention also contemplates mixing the deposition source fluxes. Mixing may occur by moving the sources, changing the source temperature, changing the gap and changing the heating element temperature.

DETAILED DESCRIPTION OF THE EMBODIMENTS

Figure 1:
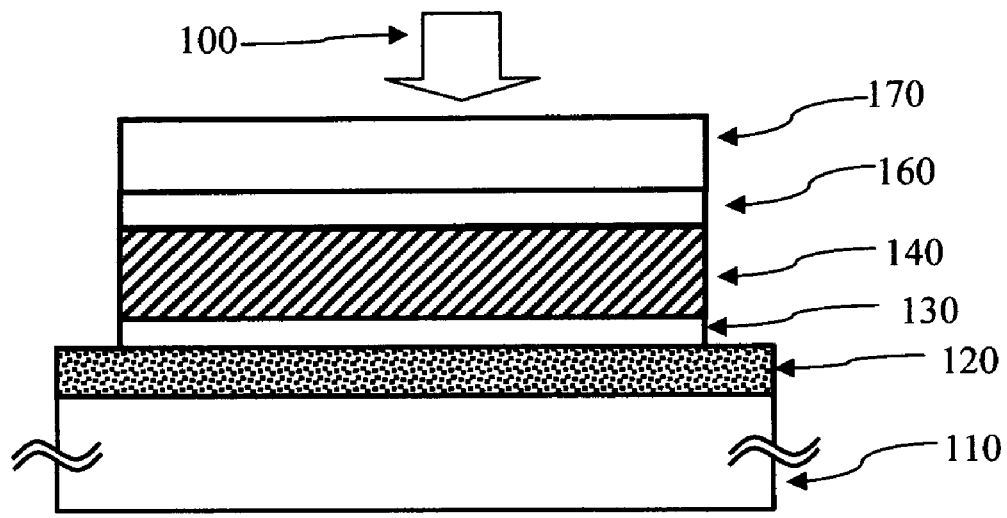
FIG. 1 shows a general schematic of a side view of a prior art device depicting a solar cell with substrate configuration.

Reference will now be made in detail to some specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In this specification and the appended claims, the singular forms "a," "an," and "the" include plural reference unless the context clearly dictates otherwise. Unless defined otherwise, all technical and scientific terms used herein have the same meaning as commonly understood to one of ordinary skill in the art to which this invention belongs.

"Interface layer" as used herein is meant to include a layer or plurality of layers between the absorber layer and the window layer. By definition an "interface layer" includes a single layer as well as a set of multiple layers which may be 1, 2, 3, 4, 5 or more layers. Each layer or layers may independently comprise a thin film, nanoparticles, sintered nanoparticles or a combination of one or more of the three. Also, the invention contemplates that a plurality of interface layers comprising films with the same and/or different grain sizes as well as layers comprising nanoparticles, sintered nanoparticles and or thin films of different chemical compositions.

As used herein the metal electrode is also referred top as a "back contact" or "electrode".

By "photovoltaic device" as used herein it is meant a multilayered structure comprising the layers necessary where in a working environment with proper leads and connections is capable of converting light into electricity. In one embodiment the device contains at least the following layers in order: a substrate/electrode layer/absorber layer/interface layer/window layer and a TCO layer and this structure is known in the art as a "substrate configuration". In a substrate configuration the substrate may be transparent or opaque. In a preferred embodiment the substrate comprises a metal and is opaque. The device may have any further structure necessary to practically utilize the device such as leads, connections, etc. The above preferred embodiments of the present invention do not limit the order of layers or deposition order of the photovoltaic device.

The absorber layer used in conjunction with solar cells of the present invention comprises Group II-VI semiconductor compound materials. The window layer used in conjunction with the instant invention preferably comprises n-type material. The window layer may comprise those materials known in the art such as CdS, CdSe, ZnS, ZnSe and oxysulfides.

By "grain size" it is meant grains having an average grain size diameter as measured by viewing a cross section of the layer with an electron micrograph (SEM or TEM). A number of grains, for example 30, are selected because their cross section represents the diameter of the grain and not a partial cross section, and the thicknesses of the selected grains are measured at their thickest point. An average thickness of the selected grains is calculated and this is the average grain size diameter.

By "small grain sizes" it is meant grain sizes having a diameter of between about 0.1 and 1.0 µm.

By "large grain sizes" it is meant grain sizes having a diameter of between about 2-6 µm.

By "plurality of grain sizes" it is meant particles having more than one grain size. In one embodiment the invention contemplates that a there be a population of small grain sizes and a population of large grain sizes.

By "surface treatment" it is meant to include the processes wet etching, dry etching, sputtering, reduction, electrochemical, heat treatments and ion milling. These examples are illustrative only and not exhaustive.

By "buried junction" it is meant a p-n junction located away from (i.e. not directly contacting) the interface of the window and absorber layers. The invention contemplates that a buried junction may extend into the absorber layer or into the interface layer.

By "forming a layer" it is meant those steps for depositing, etching, reacting scribing or otherwise creating or adding to a layer, or acting on a layer already present.

By "forming a buried junction in the absorber layer" it is meant those steps necessary to create a buried junction.

Nanoparticles or sintered nanoparticles useful in the present invention comprise compound semiconductors which include Group I-VI, II-VI, III-V and IV-VI compounds and Group IV semiconductors. This also includes I-III-VI compounds such as CIGS. CIGS is $CuIn_xGa_{1-x}Se_x$ where $0 \leqq x < 1$ and included herein is the family of materials known in the art as CIGS including CIS, CISe, CIGSe, CIGSSe. Spherical nanoparticles used herein have a size between about 1-100 nm, preferably between about 2-20 nm. It is understood that the instant invention contemplates that "nanoparticles" as used herein is not limited to spherical or substantially spherical particles but includes various shaped nanostructures such as tetrapods, bentrod, nanowires, nanorods, particles, hollow particles, single materials, alloyed materials, homogeneous and heterogeneous materials. The size of the nanoparticles is variable but it is preferred that if the particle is an elongate structure, i.e. a nanorod, that the length of the nanorod have a maximum length of about 100 nm and have a maximum diameter of about 1-20 nm, preferably about 5 nm.

Nanoparticles or sintered nanoparticles according to the instant invention may have a core or core/shell or core/shell/shell, or core/shell/shell/shell construction. The core and/or the shell can be a semiconductor material including, but not limited to, those of the Group II-VI (ZnS, ZnSe, ZnTe, CdS, CdSe, CdTe, HgS, HgSe, HgTe, MgTe and the like) and III-V (GaN, GaP, GaAs, GaSb, InN, InP, InAs, InSb, AlAs, AlP, AlSb, AlS, and the like), Group IV-V compounds, and IV (Ge, Si) materials, and an alloy thereof, or a mixture thereof. Type II heterostructures (see S. Kim, B. Fisher, H. J. Eisler, M. Bawendi, Type-II quantum dots: CdTe/CdSe(core/shell) and CdSe/ZnTe(core/shell) heterostructures, J. Am. Chem. Soc. 125 (2003)11466-11467, the contents of which are incorporated herein by reference) and alloyed quantum dots (X. H. Zhong, Y. Y. Feng, W. Knoll, M. Y. Han, Alloyed $Zn_xCd_{1-x}S$ nanocrystals with highly narrow luminescence spectral width, J. Am. Chem. Soc. 125 (2003) 13559-13563 and R. E. Bailey, S. M. Nie, Alloyed semiconductor quantum dots: tuning the optical properties without changing the particle size, J. Am. Chem. Soc. 125 (2003) 7100-7106, the contents of both are incorporated herein by reference) are considered suitable. The nanoparticles or sintered nanoparticles may have coatings or ligands attached thereto. Most of the materials listed above are quantum confined. But the invention does not require that the nanoparticles be quantum confined.

The invention contemplates that the nanoparticles used herein may be sintered or unsintered. In one embodiment of the present invention the nanoparticles are sintered or partially sintered during manufacturing and thus and the device comprises "sintered nanoparticles" or "nanoparticles that are sintered". One of ordinary skill in the art will appreciate that the sintering process will alter the morphology, size and shape of the nanoparticles. Nanoparticle interface layers according to this invention can be thermally processed (in air, inert or reducing atmosphere or vacuum) to improve their electrical properties. Other sintering methods include laser, rapid thermal processing, flash annealing and similar techniques.

In one embodiment of the present invention there is disclosed an increased efficiency solar device obtained by controlling the grain size of the absorber and/or interface layer. The morphology and grain size of the interface and/or absorber layer significantly influences the diffusion of window layer materials into the absorber layer, for example CdS into CdTe. Group II-VI absorber material films possessing very large grains such as 2-6 µm or even a larger distribution of 5-6 µm gains exhibit minimal bulk diffusion of window materials into a Group II-VI absorber layer because the diffusion is predominantly one dimensional. This is undesirable. If the grains at the surface of the absorber layer or in an interface layer are smaller as contemplated in one embodiment of the present invention, for example 0.1 to 1.0 µm, the bulk diffusion is enhanced significantly because the increased grain boundary diffusion of the smaller grains allows a window layer compound, for example CdS to diffuse from all sides of the grains producing three dimensional diffusion. Three dimensional diffusion can also result in a CdTe—CdS buried junction around the grains increasing the junction area resulting in high efficiency devices.

In a preferred embodiment of the present invention an interface layer is located between the absorber layer and the window layer comprising an alloy of a Group II-VI compound and Sulfur. While not wishing to be bound by any particular theory or principle it is believed the interface layer reduces the interface states density resulting from a 10% lattice mismatch between a window layer material such as CdS and a Group II-VI absorber material like CdTe by grading the lattice constants and also allowing the formation of a buried homo-junction in the absorber layer. Inter-diffusion of CdS and CdTe is essential to buffer the close to 10% lattice mismatch between CdS and CdTe by the formation of a $CdTe_{1-x}S_x$ alloy layer. This inter-diffusion also results in a buried electrical junction away from the CdS—CdTe metallurgical junction, which reduces the deleterious effects of interface states resulting from lattice mismatch. While not wishing to be bound by any particular theory this is probably because the formation of $CdTe_{1-x}S_x$ is less efficient compared to significant amount of grain boundary diffusion and loss of S by sublimation.

A prior art solar device having a substrate device configuration is shown in FIG. 1. Substrate 110 faces away from the sun 100 to generate photovoltaic output. Metal electrodes 120 are deposited on the substrate 110 using known techniques. Since it is not possible for any known metal electrode to form ohmic contacts with CdTe interface layer 130 may be deposited on the metal electrode 120 prior to CdTe deposition, see commonly assigned Hotz et al., U.S. Published Application No. 2009/0235986 A1, filed Mar. 13, 2009, now U.S. Pat. No. 7,858,872 B2, which claims priority to U.S. Provisional Ser. No. 61/070,006 filed Mar. 18, 2008, and U.S. Provisional Ser. No. 61/069,952 filed Mar. 18, 2008, the contents of which are hereby incorporated by reference. A CdTe absorber 140 layer is then deposited. A junction is formed by depositing a CdS window layer 160 using a PVD process such as sputtering or evaporation. A transparent contact usually a transparent conducting oxide (TCO) material layer 170 is deposited on the CdS to complete the solar cell.

Figure 2:
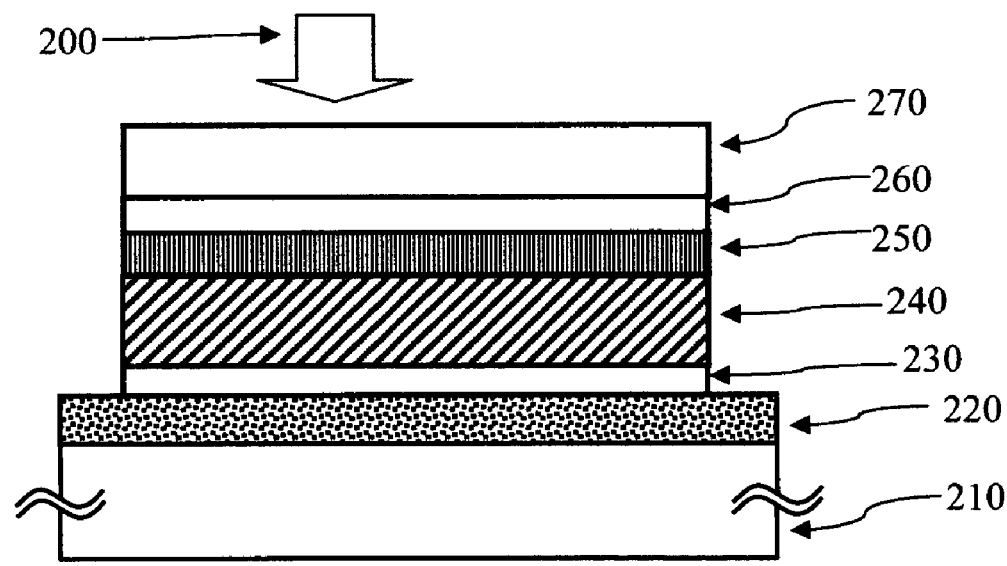
FIG. 2 shows a general schematic of a side view of one embodiment of the invention depicting a substrate CdTe solar cell with an interface layer between the absorber and the window layer.

An embodiment of the present invention incorporating an interface layer between the absorber layer and the window layer is depicted in FIG. 2. The substrate 210 is coated with a metallic electrode 220 by means of deposition techniques known in the art. The metal electrode 220 can be Mo, Ti, Al or other electrode metals. Preferred is Mo or Ti. The metal electrode layer 220 thickness can be 200-2,000 nm. The substrate 210 can be transparent such as glass, translucent such as polymer or opaque such as metal foil of Al, Ti, Cu, Mo or stainless steel. Preferred is stainless steel, Ti or Mo. Back contact layer 230 is then deposited by a PVD process such as sputtering or evaporation or by means of printing and sintering the nanoparticles. Back contact layer materials can be those disclosed in the art see commonly assigned patent application Hotz et al., U.S. Published Application No. 2009/0235986 A1, filed Mar. 13, 2009, now U.S. Pat. No. 7,858,872 B2, which claims priority to U.S. Provisional Ser. No. 61/070,006 filed Mar. 18, 2008, and U.S. Provisional Ser. No. 61/069,952 filed Mar. 18, 2008, which provide advantages in contacting absorber materials such as CdTe which do not form ohmic contacts directly with metals. A CdTe absorber layer 240 with thickness 1-10 µm deposited on top of the interface 230 using PVD processes such as Close Spaced Sublimation (CSS), sputtering or by coating with a CdTe nanoparticle ink by means of coating methods known in the art such as inkjet, die coating, blade coating or spraying followed by sintering. The CdTe layer 240 can be subjected to a $CdCl_2$ treatment to increase the grain size prior to further processing.

Referring to FIG. 2 a CdTe deposition is followed by the interface layer 250 and the window layer 260. The preferred thickness of the window layer 260 is from 0.1 to 0.2 µm. A greater thickness would result in optical loss due to increased absorption in the window layer 260. The thickness of the interface layer 250 is about 0.01 µm to 1.0 µm, preferably 0.1 µm to 0.5 µm. TCO layer 270 usually comprises ZnO doped with group III elements such as Al, Ga or and deposited using techniques such as sputtering. A bilayer TCO 270 comprising an insulation layer such as undoped ZnO and a conducting layer such as doped ZnO would help to increase the Voc of the device. The thickness of the insulation layer (not shown) may be 0.04 to 0.1 µm while the conducting layer may be 0.2 to 0.4 µm thick.

In one embodiment of the present invention the CdTe absorber layer (or an interface layer material) grain size can be controlled by controlling the substrate temperature during the evaporation process. While not wishing to be bound by an exact temperature/grain profile, a 450° C. substrate temperature during close spaced sublimation may result in CdTe films having grains sizes about 0.20 µm to 2.0 µm. A 620° C. substrate temperature during close spaced sublimation of CdTe may result in CdTe films with grain size of about 2.0-6.0 µm. The invention contemplates a temperature range of between 300° C. to 620° C. The invention prefers large grain sizes to be between 2.0-3.0 µm. In another embodiment of the present invention a temperature profile comprising high and low substrate temperatures such as 620° C. followed by 450° C. can be used to create a graded layer of grain sizes with a size reduction towards the CdTe/window layer junction in a continuous deposition process.

Figure 3:
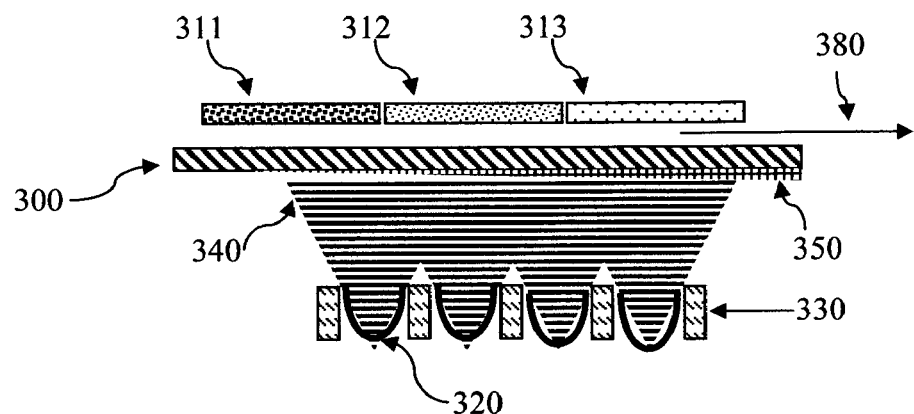
FIG. 3 shows a general schematic of a side view of one embodiment of the invention depicting a deposition system that allows the deposition of CdTe films comprising varying grain sizes.

FIG. 3 shows an embodiment of the close spaced sublimation deposition apparatus of Group II-VI films that enable Group II-VI compound grain sizes tailored in accordance with the present invention. Herein there is disclosed grain size growth in an interface layer but the invention contemplates equally well the formation of grain size growth in the absorber layer. CdTe is the preferred Group II-VI semiconductor compound. The deposition system includes CdTe sublimation sources 320 and fluxes 340 separated by thermal insulators 330 to reduce the thermal cross talk between the sources. The substrate 300 is heated using substrate heaters 311, 312 and 313 in the close proximity to the substrate 300. The direction of the substrate transport is shown by arrow 380. However, the invention also allows for reverse substrate deposition. The deposition starts at a high substrate temperature and reduces to a lower temperature to enable the formation of smaller grains on the CdTe film surface 350 by varying the substrate heater 311, 312 and 313 temperatures. Preferably the higher substrate temperature is about 550° C. to about 650° C. and the low temperature is about 400° C. to about 450° C. The low temperature may be lower, depending on the Group II-VI compound or the window layer compound. As low as 300° C. is contemplated. In another embodiment CdTe films with uniformly small grains can be deposited by reducing the substrate heater temperature on all heaters 311, 312 and 313.

In another embodiment of the present invention there is contemplated a two step sintering process employed to create similar grain morphology in either an absorber layer or an interface layer. A dispersion of nano or submicron size Group II-VI compound (preferably CdTe) particles are dispensed and sintered at a high temperature followed by another dispensing of the same Group II-VI dispersion that annealed at a lower temperature. In one non-limiting example the thickness of the grains in the first layer can be between 2-6 μm, preferably 2-3 μm, and the second layer can be 0.05 to 01.05 μm. The grain size distribution of particles in each layer is low and the invention contemplates that most layer will have a closes grain size distribution. The substrate temperature for the first layer can be 550° C. to 600° C. and the second layer can be 450° C. to 500° C.

Figure 4:
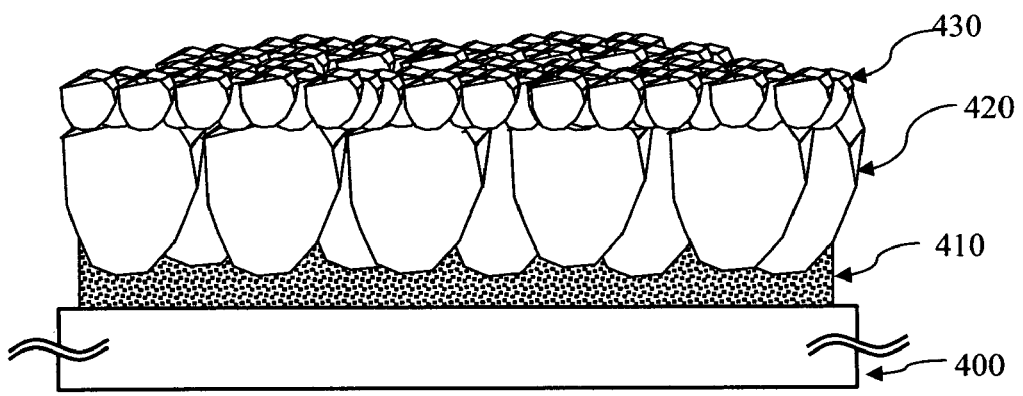
FIG. 4 shows a general schematic of a side view of one embodiment of the invention depicting a film grain structure in the absorber layer.

FIG. 4 shows the schematic of the grain structure that result from one embodiment of a CdTe deposition shown in FIG. 3. The higher substrate temperature during the initial phase of the deposition results in larger grains 420. It is preferred that these grain sizes be about 2-6, preferably 2-3 μm, with a narrow distribution of sizes. The lower substrate temperature towards the end of the deposition results in smaller grains 430. Preferably the size of the small particles is between 0.1 and 1.0 μm, with a narrow distribution of sizes in an individual layer, preferably the sizes are within 10%. The invention contemplates that the grain sizes are not limited to one or two layers but that there may be a gradation of grain sizes of three or more. The invention prefers that the smallest grain size be on the top layer of any stack of plurality of grain sizes and closest to the window layer, the interface layer or the junction, depending on the device construction. The invention contemplates that the grain sizes not be restricted to an interface layer but may also be in the absorber layer. For example a top portion of the absorber layer may comprise particles having a small diameter.

The invention described herein contemplates three different processes to obtain the interface layer with lattice constants engineered to reduce the interface states. It is understood that these embodiments are illustrative but not exhaustive.

In one embodiment of the present invention a window layer comprising for example CdS with a thickness of about 0.1 to 0.15 μm is deposited on a CdTe film with a Cd rich surface or surface with small CdTe grains (after low temperature CdTe deposition). The films are then annealed at a temperature ranging from 400° C. to 550° C. for a 10 to 30 min duration. This temperature treatment can also be carried out in the presence of $CdCl_2$ vapor from either a vapor source or $CdCl_2$ applied directly on CdS surface using a saturated solution of $CdCl_2$ in methanol. The effect of $CdCl_2$ and temperature on CdS diffusion during device processing is known see *"Study of in-situ $CdCl_2$ treatments on CSS deposited CdTe films and CdS/CdTe solar cells"* P. D. Paulson and V. Dutta, Thin Solid films, 370, 2000, pp 299-306 the contents of which are incorporated herein by reference.

In another embodiment of the present invention an interface layer is created by depositing a Group II-VI absorber layer followed by the deposition of a Group II-VI$^a_{1-x}$VI$^b_x$ compound, a≠b, alloy with x varying from 0 to 1 forming a gradient of pure CdTe near the absorber layer and pure CdS near the window layer. This is particularly suitable for a continuous roll to roll fabrication of the device structure without a vacuum break. Thermal sources can be arranged in such a way that the flux changes from pure CdTe through CdTe deposition followed by interface layer where x varies from 0 to 1 followed by the deposition of pure CdS flux for the CdS film deposition. During this deposition, the substrate temperature is changed from 550° C.-650° C. for CdTe deposition to 250° C.-350° C. during interface layer deposition and finally to 200° C. to 300° C. for CdS deposition. Depending on the material, temperatures higher than 400° C. during or after the interface layer deposition could result in a segregation of secondary phases in the interface layer because of the miscibility gap in the CdS—CdTe phase diagram. The solubility of Sulfur in CdTe is only 5.8% see *"Thin Film Cadmium Telluride—Cadmium Sulfide alloys and devices"* D. G. Jensen, B. E. McCandless and R. W Birkmire, 25$^{th}$ IEEE Photovoltaic Specialist Conference, 1996, pp 773-776 the contents of which are incorporated herein by reference. Because of this reason the interface layer approach described in this invention is not suitable for a superstrate configuration, where the CdTe deposition temperature exceeds 450° C. temperature.

A low temperature deposition of a Group II-VI$^a_{1-x}$VI$^b_x$ compound, a≠b, where 0<x<1, for example $CdTe_{1-x}S_x$ where 0<x<1, followed by the heat treatment at temperature >400° C. prior to CdS deposition can also be used to precipitate the CdS to the $CdTe_{1-x}S_x$ grain boundary and forming three dimensional junction of $CdTe_{94.6}S_{5.8}$/CdS.

In a third embodiment multiple thin films comprising various stoichiometric amounts of a Group II-VI$^a_{1-x}$VI$^b_x$ compound, a≠b where 0<x<1, for example, $CdTe_{1-x}S_x$ with x varying from 0 to 1 is dispensed using a dispersion of $CdTe_{1-x}S_x$ nano or sub micron particle on surface treated CdTe film. The film stack is then heat treated at temperature 250° C. to 450° C. in an inert ambient. This temperature treatment can also be carried out in the presence of $CdCl_2$ vapor from either a vapor source or $CdCl_2$ applied directly on CdS surface using a saturated solution of $CdCl_2$ in methanol.

In a preferred embodiment the interface layer comprises a stoichiometric gradient of $CdTe_{1-x}S_x$ composition where $0 \leq x \leq 1$ between CdTe and CdS.

In another alternative embodiment of the present invention there is contemplated various stoichiometric amounts of Group II-VI$^a_{1-x}$VI$^b_x$ compound where a≠b and 0<x<1, for example, $CdTe_{1-x}Se_x$ is dispensed using a dispersion of $CdTe_{1-x}Se_x$ nano or sub micron particle on a surface treated CdTe film. The film stack is then heat treated at temperature 250° C. to 450° C. in an inert ambient. This temperature treatment can also be carried out in the presence of $CdCl_2$ vapor from either a vapor source or $CdCl_2$ applied directly on CdS surface using a saturated solution of $CdCl_2$ in methanol.

It is preferred that the CdTe surface undergo treatments prior to deposition of the CdS window layer as well as thermal treatment after the deposition of the CdS window layer. In one embodiment the treatment removes native oxides such as $CdTeO_3$, or CdO from the CdTe surface. This treatment is particularly significant for a batch production process that involves a vacuum bake or exposure of the CdTe surface to an oxidizing gas ambient in the production process resulting in the formation of oxides. Wet as well as dry processes can be used for this process. A short wet etch in Br-methanol solution can be used to remove the surface oxides, see *"The dynamics of Cadmium Telluride Etching"* K. D. Dobson, P. D. Paulson, B. E. McCandless and R. W. Birkmire, Mat. Res. Soc. Symp. Proc. Vol. 763, 2003, pp B3.1.1-12 the contents of which are incorporated herein by reference. Sputtering, reduction in hydrogen plasma or heat treatments in Hydrogen or forming gas is particularly suitable for the dry process. Sputter process parameters such as process pressure, sputter power are tweaked to reduce the sputter damage on the CdTe surface. Previously sputter cleaning has been employed to clean the CdTe surface prior to contacting with metal electrode see *"RF sputtering as a surface cleaning process for CdTe solar cells"* V. Viswanathan, D. L. Morel and C. S. Ferekides, 31$^{st}$ IEEE Photovoltaic Specialist conference, 2005, pp 426-429 the contents of which are incorporated herein by reference. High process pressure such as 150 to 400 mTorr and low sputter power such as 30-100 watts inch is particularly suitable for the removal of oxides.

Another embodiment of the present invention envisions a surface treatment to remove the accumulation of deleterious trace elements on the absorber layer surface that diffused from the metal substrate as a result of the high temperature CdTe deposition. For example, Cu from a Cu doped ZnTe interface layer between the metal back contact and the absorber layer can diffuse through CdTe grain boundaries during CdTe deposition and create acceptor states in window layer and thereby compensate the n-type dopants. Previous studies show that Cu concentration higher than $10^{20}/cm^3$ in CdS would severely affect the device results, see *"Introduction of Cu in CdS and its effect on CdTe/CdS solar cells"* K. Barri, M. Jayabal, H. Zhao, S. Asher, J. W. Pankow, M. R. Young and C. S. Ferekides, 31$^{st}$ IEEE Photovoltaic Specialist conference, 2005, pp 287-290, the contents of which are incorporated herein by reference. As a remedy preferential sputtering provides means to selectively sputter clean the trace elements. For example, Cu has higher sputter yield with respect to CdTe and hence traces of these elements can be preferentially sputtered. Selection of sputter power and the process pressure is very crucial for the selectively sputtering the trace elements without damaging the CdTe surface. For example a high sputter power density such as 100 to 200 watts/inch$^2$ and low process pressure such as 1-2 mTorr would result in sputter damages on CdTe surface which results in heavily compensated surface regions with very low acceptor density. A preferred sputter clean process employs a low sputter power (1-2 watts/square inch) to reduce the sputter damage and higher process pressure (15-20 mTorr) to increase the scattering and thereby reduce the sputter damage and also increase the sputtering from grain boundaries. Adding forming gas in to the sputter gas aids in removing both oxides as well as the metal traces. Assuming that all the Cu traces has been diffused to the CdTe surface during and later removed by the sputter cleaning process, a high temperature annealing process can be used to anneal out all the sputter damage prior to the CdS deposition.

Another embodiment of the present invention contemplates a treatment to create Group VI vacancies in the absorber layer, for example Te vacancies in a CdTe absorber layer. This advantageously enhances sulfur diffusion to CdTe lattice. The surface treatment described here creates a Te depleted CdTe surface to enhance the formation of $CdTe_{1-x}S_x$ alloy formation during subsequent CdS deposition. The invention contemplates that a wet as well as a dry process can be employed to create a Cd rich surface. For example selective electro chemical dissolution of Te by using suitable electropotential can be employed to create a Cd rich surface. This is possible because the standard electrode potential of Te (+0.55V) is more positive compared to Cd (−0.4V). Dry process has its own advantages and hence Ion milling which has been employed in the past on superstrate configuration device prior to contact application becomes an ideal candidate. Ion milling results shows that the resulting CdTe surface composition depends on the ion milling time and it has been employed to create Te rich surface see *"Studies of ZnTe back contacts to CdS/CdTe solar cells"* T. A. Gessert, P. Sheldon, X. Li, D. Dunlavy, D. Niles, 26$^{th}$ IEEE Photovoltaic Specialist conference, 1997, pp 419-422, the contents of which are incorporated herein by reference. In another embodiment of the present invention there is contemplated an interface layer comprising a Te rich CdTe composition that may be used advantageously to block Cu migration.

Figure 5:
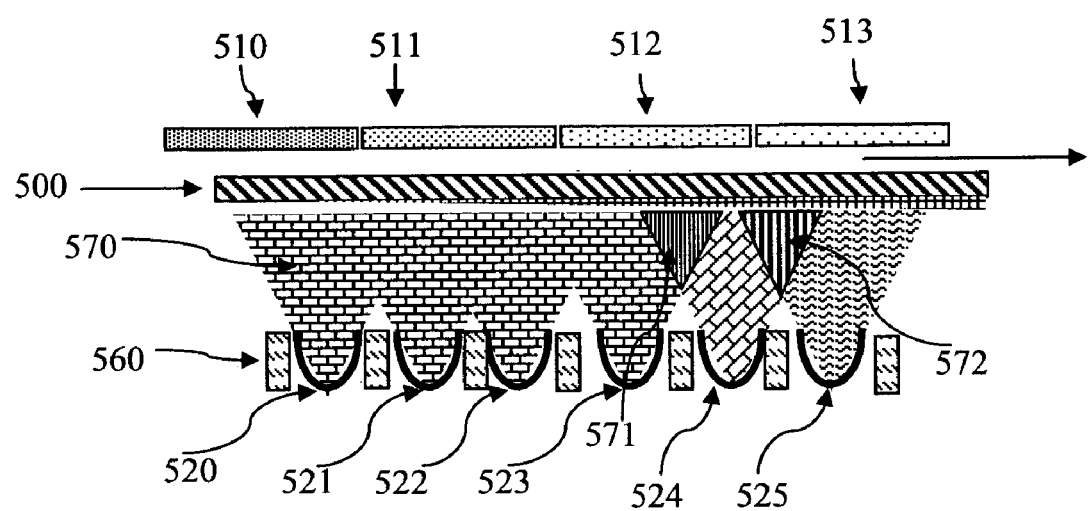
FIG. 5 shows a general schematic of a side view of one embodiment of the invention depicting a deposition system that allows the deposition of a $CdTe/CdTe_{1-x}S_x/CdS$ device structure without vacuum break.

FIG. 5 shows an embodiment of a close spaced sublimation deposition system of Group II-VI films that enable the deposition of a an absorber layer, preferably comprising CdTe, an interface layer having a Group II-VI-S gradient, preferably a CdTeS gradient followed by the CdS window layer to form a full device structure in a continuous fashion without vacuum break. The deposition system includes CdTe sublimation sources 520, 521, 522 and 523, a $CdTe_{0.5}S_{0.5}$ source 524 and CdS source 525 separated by thermal insulators 560 to reduce the thermal cross talk between the sources. In close proximity to the substrate 500 are heaters 510, 511, 512 and 513 for implementing various heating profiles to the substrate. The invention contemplates that any number of heaters may be employed. In a preferred embodiment the deposition starts at high substrate temperature at heater 510 (550° C. to 650° C.) and maintained at high temperature during CdTe deposition and is reduced to a low temperature (250° C. to 350° C.) during the interface layer deposition and further reduced to 200° C. to 300° C. range during the CdS layer deposition. The mixing of the fluxes 570 from sources 523, 524 and 525 allows the formation of an interface layer having a graded composition comprising $CdTe_xS_{1-x}$ where $0 \leq x \leq 1$ interface layer. The invention contemplates the mixing of the fluxes 571 from sources 523 (CdTe) and 524 ($CdTe_{0.5}S_{0.5}$) (as non limiting examples of source compositions) as well as the mixing of the fluxes 573 from sources 524 ($CdTe_{0.5}S_{0.5}$) and 525 (CdS) will result in films having stoichiometric gradations of the $CdTe_{1-x}S_x$. The flux mixing 571 and/or 572 is generally not uniform. Fluxes may be mixed, for example by moving sources close enough to one another. This may be about 1 or 2 inches but may be less or more depending on the deposition parameters. For a high vacuum process they sources may be farther apart. Also by using the temperature profile mentioned above the composition grading in the interface layer is retained without the formation of secondary phases. Non-limiting methods to mix the flux include changing the temperature of any of the sources which will raise or lower the flux concentration. Changing the gap of the source to substrate will change the mixed flux composition as well. More gas pressure results in more flux mixing. Changing the temperature of the heating elements 510, 511, 512 and 513 will result in a different sticking coefficient for each substrate location and by producing a gradation of temperature with the four (or more) heaters the deposited composition may have a graded stoichiometric composition. The deposition scheme described here not limited to CSS and in fact it also work with any other PVD techniques such as Laser ablation, sputtering or high rate vapor deposition etc.

What is claimed is:

1. A photovoltaic device having a substrate configuration, comprising:
    a substrate,
    said substrate being transparent or opaque,
    a metal electrode layer,
    a transparent conductor layer,
    an absorber layer comprising a Group II-VI semiconductor compound,
    a window layer, and
    an interface layer between the absorber layer and the window layer, wherein:

said interface layer comprises a gradation of grain sizes from small grain sizes to large grain sizes where the smallest grain size is closest to the window layer.

2. A photovoltaic device as claimed in claim 1, wherein: the absorber layer comprises CdTe.

3. A photovoltaic device as claimed in claim 1, wherein: the window layer comprises CdS.

4. A photovoltaic device of claim 1 wherein: the absorber layer and/or the interface layer each independently comprise a thin film, nanoparticles and/or nanoparticles that are sintered.

5. A photovoltaic device according claim 1, wherein: the absorber layer comprises a plurality of grain sizes.

6. A photovoltaic device as claimed in claim 1, wherein: the large grain sizes are about 2.0 µm to about 6.0 µm, and the small grain sizes are about 0.1 µm to about 1.0 µm.

7. A photovoltaic device as claimed in claim 6, wherein: the large grain sizes are about 2.0 µm to about 3.0 µm, and the small grain sizes are about 0.2 µm to about 0.5 µm.

8. A photovoltaic device of claim 1, further comprising: a buried junction between the absorber layer and the window layer.

9. A photovoltaic device of claim 1, wherein: the interface layer is created by a surface treatment of the absorber layer, wherein: the surface treatment is selected from the group consisting of wet etching, dry etching, sputtering, reduction, electrochemical, heat treatments and ion milling.

10. A photovoltaic device comprising:
a substrate,
said substrate being transparent or opaque,
a metal electrode layer,
a transparent conductor layer,
an absorber layer comprising a Group II-VI semiconductor compound,
a window layer, and
an interface layer between the absorber layer and the window layer, wherein:
the interface layer comprises a composition consisting essentially of a Group $II\text{-}VI^a_{1-x}VI^b_x$ compound, where $0<x<1$ and $a \neq b$ and said interface layer comprises a gradation of grain sizes from small grain sizes to large grain sizes where the smallest grain size is closest to the window layer.

11. A photovoltaic device as claimed in claim 10, wherein:
said interface layer comprises at least three layers,
a first layer comprising a Group II-VI compound located next to the window layer, and
a third layer comprising a Group II-VI compound located next to the absorber layer, and a second layer consisting essentially of a Group $II\text{-}VI^a_{1-x}VI^b_x$ compound, where $0<x<1$ and $a \neq b$, wherein:
the second layer is located between the first and third layers.

12. A photovoltaic device as claimed in claim 11, wherein:
the first layer comprises CdS,
a third layer comprises CdTe, and
the second layer consists essentially of $CdTe_{1-x}S_x$ where $0<x<1$.

13. A photovoltaic device as claimed in claim 10, wherein:
said interface layer consists essentially of $CdTe_{1-x}S_x$ where $0<x<1$.

14. A photovoltaic device as claimed in claim 10, wherein:
a portion of said interface layer located next to the absorber layer comprises large grain sizes, and
a portion of said interface layer located next to the window layer comprises small grain sizes.

15. A photovoltaic device as claimed in claim 12, wherein:
a portion of said interface layer located next to the absorber layer comprises large grain sizes, and
a portion of said interface layer located next to the window layer comprises small grain sizes.

* * * * *